United States Patent
Danilak et al.

(10) Patent No.: US 9,177,638 B2
(45) Date of Patent: Nov. 3, 2015

(54) METHODS AND DEVICES FOR AVOIDING LOWER PAGE CORRUPTION IN DATA STORAGE DEVICES

(71) Applicants: Western Digital Technologies, Inc., Irvine, CA (US); Skyera, LLC, San Jose, CA (US)

(72) Inventors: Radoslav Danilak, Cupertino, CA (US); Rodney N. Mullendore, San Jose, CA (US); Andrew J. Tomlin, San Jose, CA (US); Justin Jones, Burlingame, CA (US); Jui-Yao Yang, San Jose, CA (US)

(73) Assignees: Western Digital Technologies, Inc., Irvine, CA (US); Skyera, LLC, San Jose, CA (US)

( * ) Notice: Subject to any disclaimer, the term of this patent is extended or adjusted under 35 U.S.C. 154(b) by 34 days.

(21) Appl. No.: 13/675,913

(22) Filed: Nov. 13, 2012

(65) Prior Publication Data
US 2014/0133220 A1    May 15, 2014

(51) Int. Cl.
  *G11C 11/56*    (2006.01)
  *G11C 11/16*    (2006.01)
  *G06F 12/02*    (2006.01)

(52) U.S. Cl.
  CPC ........ *G11C 11/5628* (2013.01); *G06F 12/0246* (2013.01); *G11C 11/16* (2013.01); *G06F 2212/7203* (2013.01)

(58) Field of Classification Search
  CPC ... G06F 12/0246; G06F 11/1441; G06F 1/30; G06F 3/068; G06F 3/0614; G06F 11/1402
  USPC .......... 365/158, 145, 148, 153, 157; 711/103; 713/300
  See application file for complete search history.

(56) References Cited

U.S. PATENT DOCUMENTS

| | | | |
|---|---|---|---|
| 6,856,556 B1 | 2/2005 | Hajeck |
| 7,126,857 B2 | 10/2006 | Hajeck |
| 7,424,587 B2 | 9/2008 | Caulkins et al. |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |

(Continued)

OTHER PUBLICATIONS

International Search Report and Written Opinion dated Jan. 28, 2014 from PCT/US2013/062725, Applicant: Western Digital Technologies, Inc., filed Sep. 30, 2013, 10 pages.

*Primary Examiner* — Douglas King
*Assistant Examiner* — Ajay Ojha
(74) *Attorney, Agent, or Firm* — Wilmer Cutler Pickering Hale and Dorr LLP

(57) ABSTRACT

A data storage device may comprise a plurality of Multi-Level Cell (MLC) non-volatile memory devices comprising a plurality of lower pages and a corresponding plurality of higher-order pages. A controller may be configured to write data to and read data from the plurality of lower pages and the corresponding plurality of higher-order pages. A buffer may be coupled to the controller, which may be configured to accumulate data to be written to the MLC non-volatile memory devices, allocate space in the buffer and write the accumulated data to the allocated space. At least a portion of the accumulated data may be written in a lower page of the MLC non-volatile memory devices and the space in the buffer that stores data written to the lower page may be de-allocated when all higher-order pages corresponding to the lower page have been written in the MLC non-volatile memory devices.

33 Claims, 5 Drawing Sheets

(56) References Cited

U.S. PATENT DOCUMENTS

| | | |
|---|---|---|
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,027,194 B2 * | 9/2011 | Lee et al. ................. 365/185.03 |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2008/0071972 A1 * | 3/2008 | Kimura ........................ 711/103 |
| 2008/0126671 A1 * | 5/2008 | Kashiwada .................... 711/101 |
| 2008/0144373 A1 * | 6/2008 | Roohparvar ............. 365/185.03 |
| 2008/0162789 A1 * | 7/2008 | Choi et al. ..................... 711/103 |
| 2008/0177923 A1 | 7/2008 | Klein |
| 2008/0189473 A1 | 8/2008 | Murray |
| 2008/0195798 A1 | 8/2008 | Lee et al. |
| 2010/0174849 A1 | 7/2010 | Walston et al. |
| 2010/0250793 A1 | 9/2010 | Syu |
| 2010/0318839 A1 | 12/2010 | Avila et al. |
| 2010/0332862 A1 * | 12/2010 | Lester et al. .................. 713/300 |
| 2011/0093650 A1 | 4/2011 | Kwon et al. |
| 2011/0099323 A1 | 4/2011 | Syu |
| 2011/0202710 A1 | 8/2011 | Zhao et al. |
| 2011/0283049 A1 | 11/2011 | Kang et al. |
| 2012/0047318 A1 * | 2/2012 | Yoon et al. ..................... 711/103 |
| 2012/0054582 A1 | 3/2012 | Byom et al. |
| 2012/0063255 A1 | 3/2012 | Nakazumi |
| 2012/0166720 A1 | 6/2012 | Roohparvar |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0132638 A1 | 5/2013 | Horn et al. |
| 2013/0145106 A1 | 6/2013 | Kan |
| 2013/0173848 A1 * | 7/2013 | Lassa et al. ................... 711/103 |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115425 A1 * | 4/2014 | Camalig et al. ............... 714/769 |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

METHODS AND DEVICES FOR AVOIDING LOWER PAGE CORRUPTION IN DATA STORAGE DEVICES

BACKGROUND

Flash memory is a non-volatile computer storage technology that can be electrically erased and reprogrammed. Flash memory is typically written in blocks and allocated, garbage collected and erased in larger super blocks or S-Blocks.

Flash memory comprises a plurality of cells, with each cell being configured to store one, two or more bits per cell. SLC is an abbreviation of "Single-Level Cell", which denotes a configuration in which each cell stores one bit. SLC is characterized not only by fast transfer speeds, low power consumption and high cell endurance, but also by relatively high cost. MLC is an abbreviation of "Multi-level Cell", which denotes a configuration in which each cell stores two or more bits per cell. The acronym MLC is often used to denote a Flash memory having cells that store two bits per cell. That same acronym MLC is also used, however, to designated Flash memory having cells configured to store three bits per cell (also called "TLC" or Triple or Three Level Cell) or even a greater number of bits per cell. When MLC is used to designate a memory that stores two bits in each cell, such an MLC Flash memory may be characterized by somewhat slower transfer speeds, higher power consumption and lower cell endurance than a Single-Level Cell memory. Such MLC memories, however, enjoy a comparatively lower manufacturing cost per bit than do SLC memories.

In MLC NAND Flash memory, the same physical page of memory cells may be used to store two or more logical pages of data, with each cell being configured to store 2 or more bits. When two bits per cell are stored, a first bit of a lower page is stored first, and then the next bit or bits of one or more higher-order pages are stored. The lower page is programmed first, followed by the higher-order page or pages. When programming the upper page, programming voltages are applied to the same cells that already store valid data in the lower page. Should power fail during the programming of the higher-order page or pages, the stored data in the lower page may be irrecoverably corrupted, as may be the data intended to be stored in the higher-order page or pages. This problem is compounded by the fact that the host may have already received an acknowledgment from the data storage device indicating that the data stored in the lower page has already been saved to the Flash memory.

FIG. 1 is a block diagram of aspects of conventional Flash data storage device. As shown therein, the Flash data storage device 100 comprises a controller 104. The controller 104 is coupled to an array of non-volatile memory (e.g., Flash memory devices), collectively referenced at numeral 102. Conventionally, to provide power-fail protection, conventional Flash data storage devices include a backup power source, as shown at 106 in FIG. 1. As indicated at 106, super-capacitors or an array of discrete capacitors are conventionally used to maintain the controller 104 and the non-volatile memory 102 powered-up during a power loss, typically only long enough to finish programming the data to the Flash memory devices 102. Indeed, these super-capacitors or array of discrete capacitors are configured to store a sufficiently large amount of energy to enable the controller 104 to complete any firmware operation (such as a write operation) upon power loss. This is not optimal, however, because super-capacitors are large, unreliable, prone to problems and expensive.

DETAILED DESCRIPTION

Within the scope of the present disclosure, the acronym "MLC" expressly denotes a Flash memory comprising cells that store two or more bits per cell. In the case wherein such MLC Flash memory is configured to store two bits per cell, data is stored in a lower page and a corresponding upper page. In the case wherein such MLC Flash memory is configured to store three or more bits per cell, data is stored in a lower page and one or more corresponding higher-order pages. The phrase "higher-order pages" is expressly intended to cover the upper page and/or the upper page and one or more pages of higher order.

Figure 1:
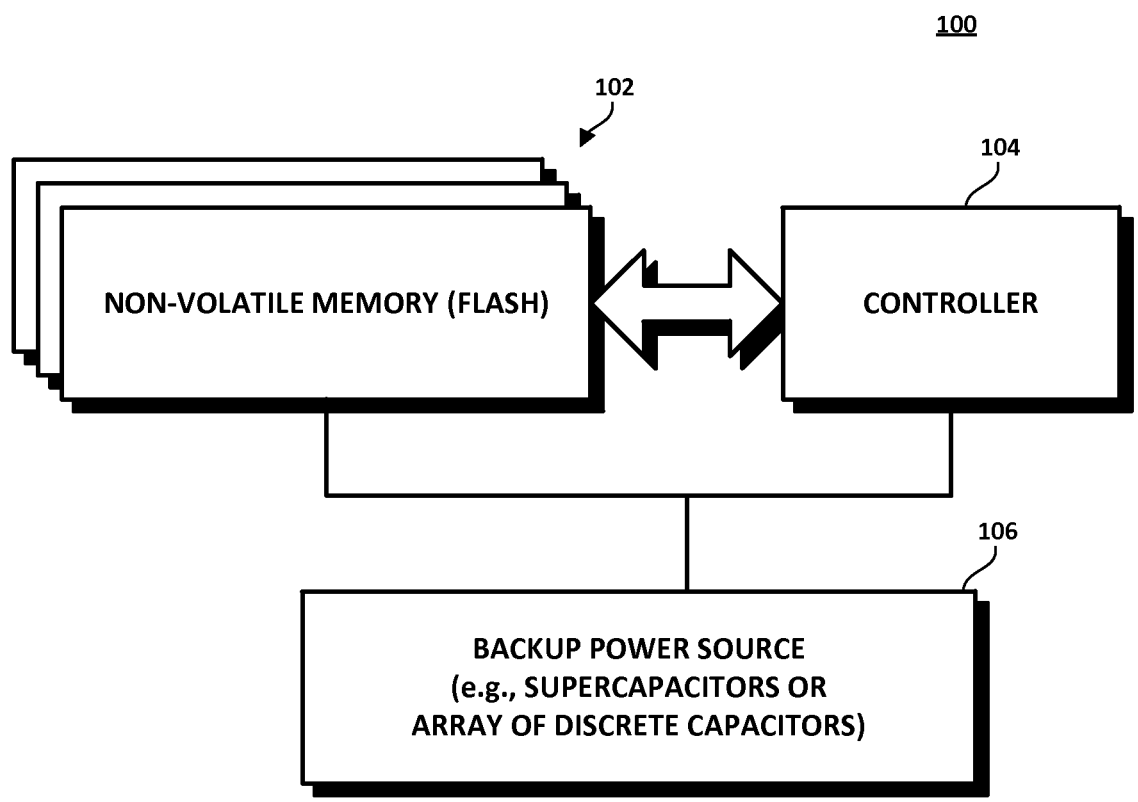
FIG. 1 is a block diagram of aspects of a conventional Flash data storage device.
Figure 2:
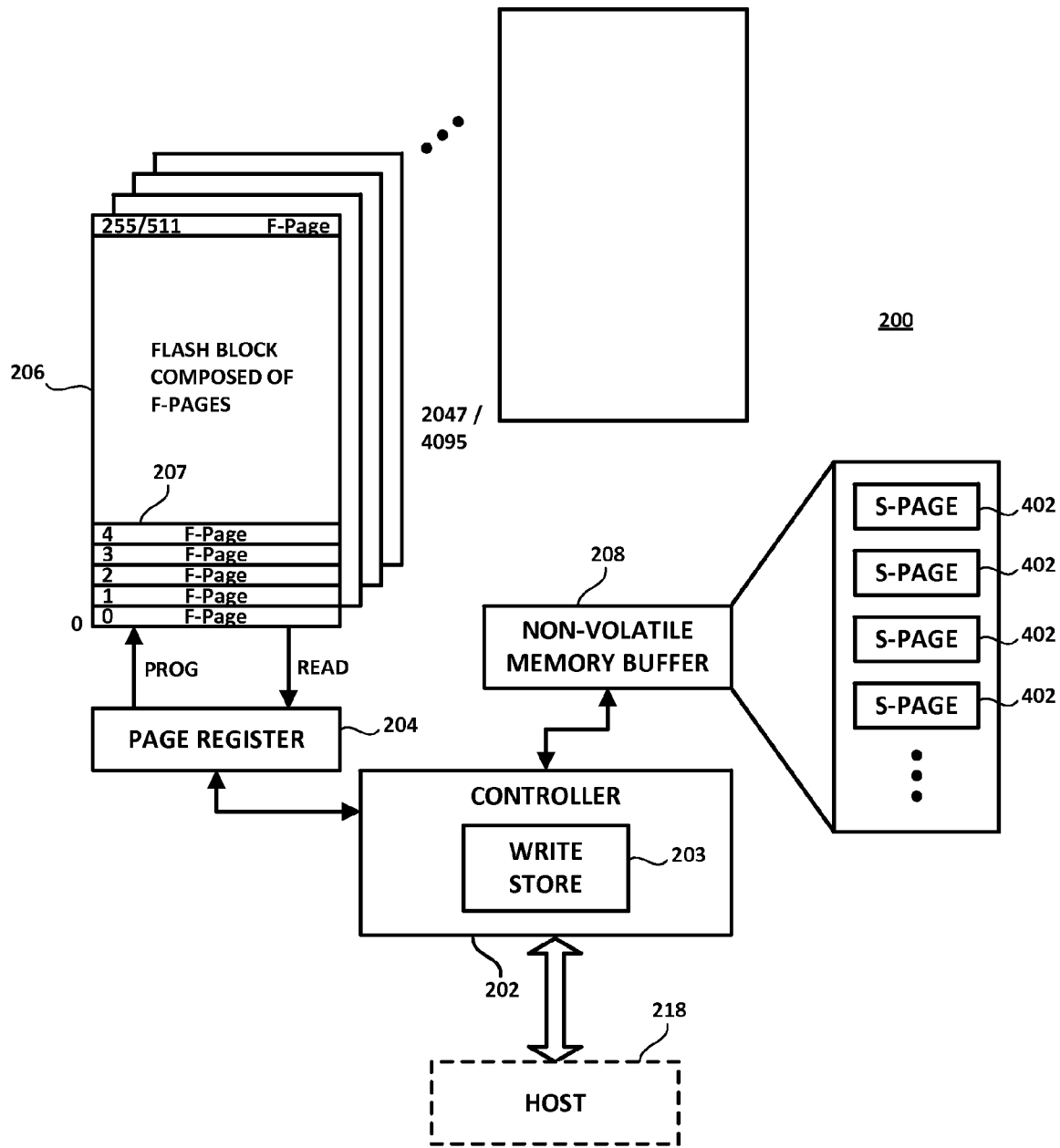
FIG. 2 is a diagram showing aspects of the physical and logical data organization of a data storage device according to one embodiment.

FIG. 2 is a diagram showing aspects of the physical and logical data organization of a data storage device 200 according to one embodiment. In one embodiment, the data storage device is an SSD. In another embodiment, the data storage device is a hybrid drive including Flash memory and rotating magnetic storage media. The disclosure is applicable to both SSD and hybrid implementations, but for the sake of simplicity the various embodiments are described with reference to SSD-based implementations. A data storage device controller 202 according to one embodiment may be configured to be coupled to a host, as shown at reference numeral 218. The host 218 may utilize a logical block addressing (LBA) scheme. While the LBA size is normally fixed, the host can vary the size of the LBA dynamically. For example, the physical data storage device may be logically portioned to support partitions configured for LBAs of different sizes. However, such partitions are not required for the physical device to support LBAs of different sizes at the same time. For example, the LBA size may vary by interface and interface mode. Indeed, while 512 bytes is most common, 4 KB is also becoming more common, as are 512+(520, 528 etc.) and 4 KB+(4 KB+8, 4K+16 etc.) formats. As shown therein, the data storage device controller 202 may comprise or be coupled to a page register 204. The page register 204 may be configured to enable the controller 202 to read data from and store data to the data storage device 200. The controller 202 may be configured to program and read data from an array of Flash memory devices responsive to data access commands from the host 218. While the description herein refers to Flash memory generally, it is understood that the array of memory devices may comprise one or more of various types of non-volatile memory devices such as Flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

The page register 204 may be configured to enable the controller 202 to read data from and store data to the array. According to one embodiment, the array of Flash memory devices may comprise a plurality of non-volatile memory devices in die (e.g., 128 dies), each of which comprises a plurality of blocks, such as shown at 206 in FIG. 2. Other page registers 204 (not shown), may be coupled to blocks on other die. A combination of Flash Blocks, grouped together, may be called a Superblock or S-Block. In some embodiments, the individual blocks that form an S-Block may be chosen from one or more dies, planes or other levels of granularity. An S-Block, therefore, may comprise a plurality of Flash Blocks, spread across one or more die, that are combined together. In this manner, the S-Block may form a unit on which the Flash Management System (FMS) operates. In some embodiments, the individual blocks that form an S-Block may be chosen according to a different granularity than at the die level, such as the case when the memory devices include dies that are sub-divided into structures such as planes (i.e., blocks may be taken from individual planes). According to one embodiment, allocation, erasure and garbage collection may be carried out at the S-Block level. In other embodiments, the FMS may perform data operations according to other logical groupings such as pages, blocks, planes, dies, etc.

According to one embodiment, the array of MLC non-volatile memory devices may comprise a plurality of lower pages and a corresponding plurality of higher-order pages. That is, each lower page may be associated with a corresponding single upper page or with a corresponding plurality (i.e., two or more) of higher-order pages. The MLC non-volatile memory devices may be organized in Flash Blocks 206, with each Flash Block comprising a plurality of Flash Pages (F-Pages) 207, as shown in FIG. 2. Alternatively, a different physical organization may be employed. An F-Page, according to one embodiment, may be the size of the minimum unit of program of the non-volatile memory devices. The controller 202 may be coupled to the plurality of non-volatile memory devices and may be configured to write data to and read data from the plurality of lower pages and to one or more corresponding higher-order pages. To address the lower-page corruption problem afflicting conventional data storage devices, one embodiment of a data storage device 200 comprises a buffer 208. In one embodiment, the buffer comprises a non-volatile memory. As write commands are received from the host 218 and executed by the controller 202, the data to be written to the MLC non-volatile memory devices (i.e., Flash Blocks 206) may be accumulated. According to one embodiment, the data to be written may be accumulated within a write store 203. The write store 203 may be coupled to the controller 202. In one embodiment, the write store 203 is a store that is internal to the controller 202. Contemporaneously with the accumulation of the data in the write store 203 (or at least shortly before or after such accumulation), the controller 202 may allocate memory space in the buffer 208 and may write the accumulated data to the allocated space in the buffer 208. According to one embodiment, the data to be written to the MLC non-volatile memory devices may be stored in both the write store 203 and the buffer 208, such that the buffer 208 and the write store 203 mirror or substantially mirror each other. Indeed, according to one embodiment, the controller 202 may be configured to accumulate data to be written in the write store 203 and in the buffer 208 until a complete F-page is constructed. According to one embodiment, a partial F-Page may be packed with a predetermined coded value and considered to be complete. Completed F-Pages may be written to the MLC non-volatile memory devices. That is, at least a portion of the accumulated data may be written to a lower page of the MLC non-volatile memory devices. According to one embodiment, previously-allocated space in the buffer 208 may be de-allocated when all higher-order pages corresponding to the lower page have been written in the MLC non-volatile memory devices. That is, the controller 202 may be configured to keep lower page data in the buffer 208 until the upper page or high-order pages corresponding to the lower page have been programmed. This ensures that a power-safe copy of the write data is maintained in the buffer 208 until both the lower and higher-order page or pages have been programmed, after which the data may be considered to be power-fail and corruption safe.

According to one embodiment, in the normal course of operation of the data storage device 200, as complete F-Pages are constructed (and accumulated in the write store 203 and written out to the buffer 208), they may be written out to the MLC non-volatile memory devices. According to one embodiment, it is the completed F-Pages stored in the write store 203 that are written out to the MLC non-volatile memory devices. Indeed, it may be preferable to write the completed F-Pages out from the write store 203 rather than from the buffer 208, as the write store 203 may be able to support a greater bandwidth than the buffer 208.

According to one embodiment, the buffer 208 may comprise non-volatile memory. For example, the buffer 208 may comprise memory that is non-volatile and that is characterized as having high access, read and write speeds. According to one embodiment, the buffer 208 may comprise Magnetic Random Access Memory (MRAM). Other memory types may also be used. MRAM may exhibit performance that similar to that of SRAM, a density comparable to DRAM and low power consumption. Moreover, MRAM is not known to degrade over time. Although relatively costly, MRAM is well suited to the task of the buffer 208; namely, to store a power-safe copy of lower page data at least until the corresponding higher-order page(s) have been safely stored in the Flash Blocks 206. It is to be noted, however that, as of this writing, the cost of implementing the buffer 208 in MRAM is still less costly than the conventional use of super-capacitors or the use of an array of discrete capacitors. In the implementation in which the buffer 208 comprises non-volatile memory such as MRAM, the data written thereto that has not yet been safely stored in the Flash Blocks 206 (such as lower page data whose corresponding higher-order page(s) were not stored to Flash before a power-fail event) may be read out from the buffer 208 by the controller 202 and stored in the Flash Blocks 206 upon restoration of the power to the data storage device 200. That is, the controller 202 may be further configured to read data from the buffer 208 and write at least a portion of the read data to the non-volatile memory devices of the Flash Blocks 206, after power is restored to the data storage device 200 subsequent to a loss of power thereto.

According to one embodiment, the buffer 208 may be configured to be at least sufficiently large to enable recovery from lower page corruption after a power loss to the data storage device. The size of the buffer 208, therefore, may vary with, for example, the number of pages between lower and higher-order pages, the size of the F-Pages, the number of planes and dies of the data storage device. For example, the size of the buffer 208 may vary from a few MB to a few hundreds of MB, although other implementations may utilize other sizes to good effect. According to one embodiment, the buffer 208 may comprise a plurality of buffers for each die, as each die completes its programming at a different time. This enables multiple pages per die to be managed independently, leading to an efficient configuration of the buffer 208. The buffer 208 may, for example, be implemented as a plurality of buffers from which the controller 202 allocates space, stores data and de-allocates space, as the higher-order page(s) of corresponding lower pages are stored in the Flash Blocks 206. Such a buffer configuration is well suited to buffering the stream of write data from host write commands until the probability of lower page corruption upon power fail is acceptably small or zero. According to one embodiment, the controller 202 may be configured to generate and send a write acknowledgement to the host 218 after (e.g., as soon as) the accumulated data is written to the allocated space in the buffer. That is, from the host's perspective, the data may be considered to have been safely stored in Flash as soon as it is stored in the buffer 208. According to one embodiment, the MLC non-volatile devices may be run in lower-page only mode or in "SLC" mode. In that case, since there are no higher-order pages to contend with, de-allocation of space in the buffer 208 may be carried out as soon as the page in MLC lower-page only mode or the page in SLC mode is programmed and need not be delayed while waiting for any higher-ordered pages to be programmed.

Figure 3:
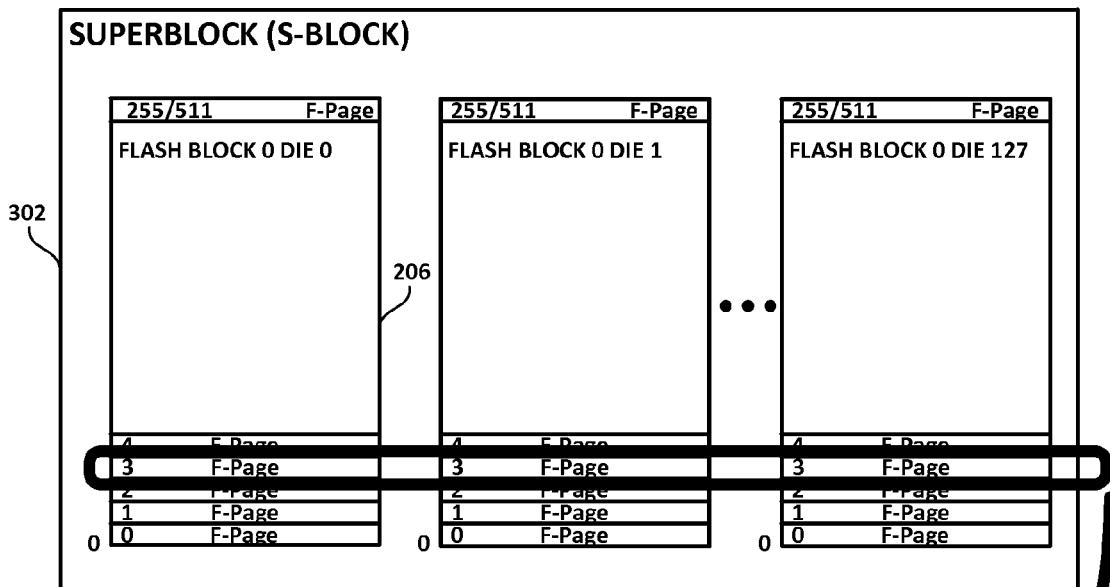
FIG. 3 is a block diagram of an S-Block, according to one embodiment.
Figure 4:
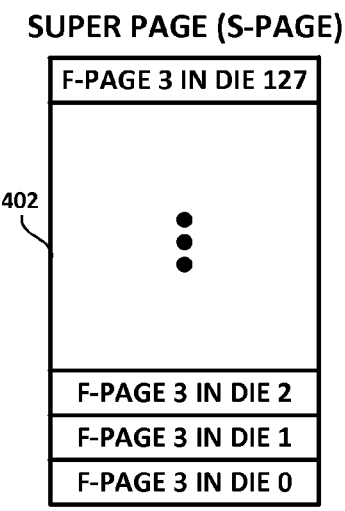
FIG. 4 is a block diagram of an S-Page, according to one embodiment.

FIG. 3 is a block diagram of an S-Block, according to one embodiment. As shown therein, an S-Block 302 may comprise one Flash block (F-Block) 206 per die. An S-Block, therefore, may be thought of as a collection of F-Blocks, one F-Block per die, that are combined together to form a unit of the Flash Management System (FMS) of the data storage device. According to one embodiment, allocation, erasure and GC may be managed at the S-Block level. Each F-Block 206, as shown in FIG. 3, may comprise a plurality of Flash pages (F-Page) such as, for example, 256 or 512 F-Pages. An F-Page, according to one embodiment, may be the size of the minimum unit of program for a given non-volatile memory device. FIG. 4 shows a super page (S-page), according to one embodiment. As shown therein, an S-page 402 may comprise one F-Page per F-Block of an S-Block, meaning that an S-page spans across an entire S-Block. According to one embodiment shown in FIG. 2, the data may be accumulated, written and stored in units of S-Pages 402. The buffer 208 may be configured to store write data organized differently than S-Pages 402, depending upon the specific implementation.

Figure 5:
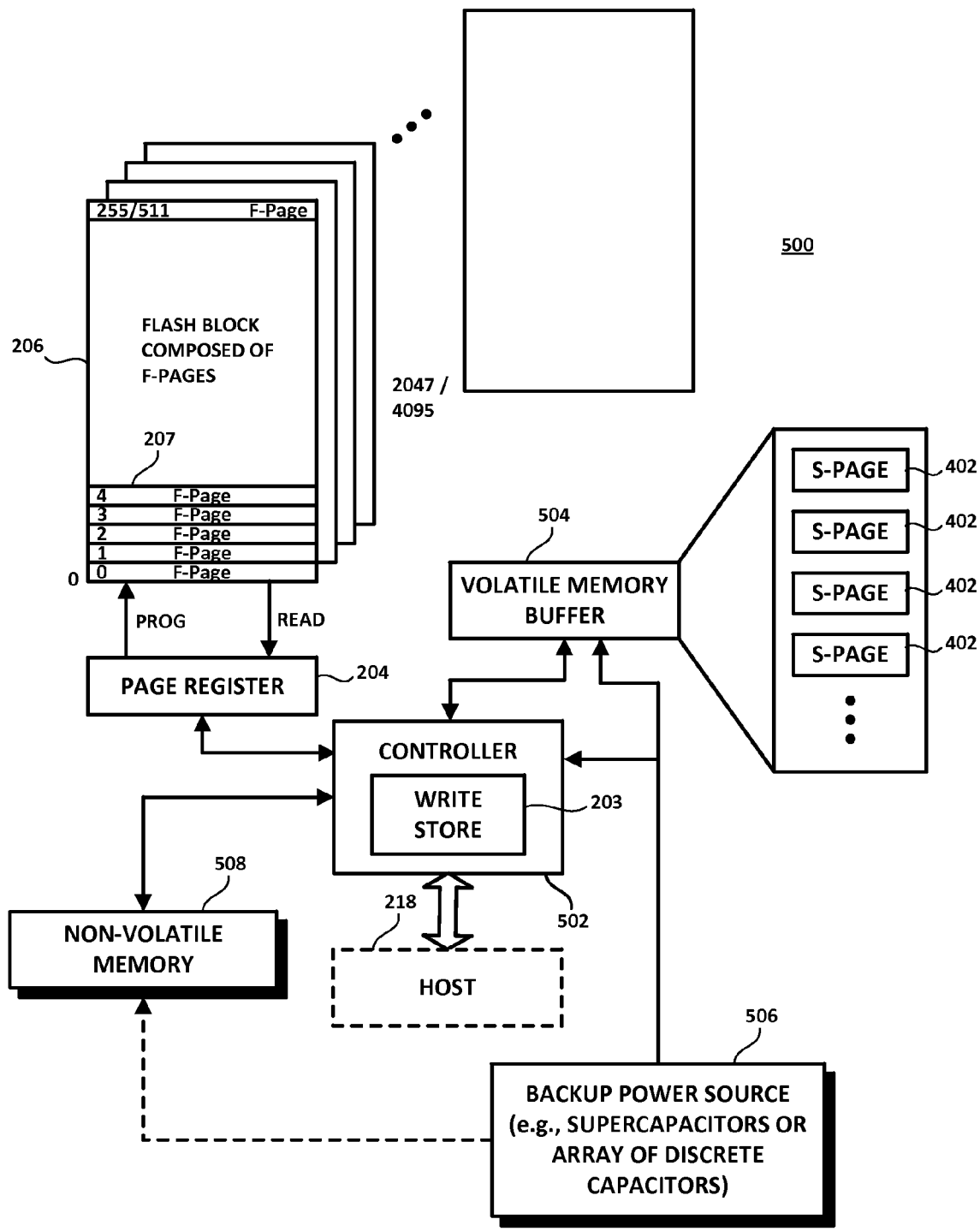
FIG. 5 is a block diagram of a data storage device according to one embodiment.

FIG. 5 is a block diagram of another data storage device 500, according to one embodiment. With reference to FIG. 2, like reference numerals denote like elements and the description of such like elements omitted for brevity. In this embodiment, the controller 502 need not (but may) comprise a write store, such as write store 203 in FIG. 2. A volatile memory buffer 504 (or a plurality of such volatile memory buffers) may be coupled to the controller 502. For example, the volatile memory buffer 504 may comprise or be configured in a Dynamic Random Access Memory (DRAM). The volatile memory buffer 504 is shown in FIG. 5 as being external to the controller 502. However, the volatile memory buffer 504 may also be internal to the controller 502, which may translate into faster access times by the controller 502. However, size and/ or other considerations may recommend that the volatile memory buffer 504 be configured as an external memory buffer coupled to the controller 502. The data storage device 500 of FIG. 5 may also comprise a backup source of power such as shown at 506 and a non-volatile memory, as shown at 508. The backup source of power 506 may be coupled to the volatile memory buffer 504, to the controller 502 and to the non-volatile memory 508. The backup source of power 506 may be configured to keep at least the volatile memory buffer 504, the controller 502 and/or the non-volatile memory 508 powered-up for a period of time upon a power fail event, without loss of data in the volatile memory 504 (at least until the contents thereof can be saved to the non-volatile memory 508). According to one embodiment, the backup power source 506 may be configured to power at least portions of the data storage device of FIG. 5 at least as long as necessary for the controller 502 to write the data from the volatile buffer 504 to the non-volatile memory 508. The backup power source 506 may comprise capacitors, super-capacitors and/or any energy storage elements. In one embodiment where the data storage device is a hybrid disk drive or a solid state drive coupled with a hard disk drive, the power source 506 may be provided by the BEMF (back electromotive force) generated from the spindle motor of the hard disk drive.

Indeed, during normal operation, as write commands are received from the host 218 and executed by the controller 502, the data to be written to the MLC non-volatile memory devices (i.e., Flash Blocks 206) may be written to both the volatile memory buffer 504 and to the MLC non-volatile memory devices. According to one embodiment, the controller 502 may be configured to accumulate data to be written (as directed by write commands issued by the host 218, for example) internally (in a write store 203, for example) until a complete F-page is constructed. Alternatively and according to one embodiment, a partial F-Page may be packed with a predetermined coded value and considered to be complete. Completed F-Pages may then be written both to the volatile memory buffer 504 and to the MLC non-volatile memory devices. According to one embodiment, the data may also be accumulated, written and stored in units of S-Pages 402 or any other data organization unit. Indeed, the volatile memory buffer 504 may be configured to store write data organized differently than S-Pages 402, depending upon the specific implementation. According to one embodiment, therefore, in addition to writing the accumulated data (or a portion thereof) to volatile memory buffer 504, the accumulated data (or a portion thereof) may be written to one or more lower and/or upper pages of the MLC non-volatile memory devices (the Flash Blocks 206). According to one embodiment, previously-allocated space in the volatile memory buffer 504 may be de-allocated and the de-allocated space therein reused for new write data when all higher-order pages corresponding to a previously-programmed lower page have been written in the MLC non-volatile memory devices and thus may be considered to be effectively corruption-safe. That is, the controller 202 may be configured to keep lower page data in the volatile memory buffer 504 at least until the upper page or high-order pages corresponding to the lower page have been programmed in the MLC non-volatile memory devices.

In the event of a power loss, the backup power source 506 may supply power at least to the controller 502, the volatile memory buffer 504 and/or the non-volatile memory 508. During the time the controller 502, the volatile memory buffer 504 and/or the non-volatile memory 508 are powered by the backup power source 506, the controller 502 may cause data stored in the volatile memory buffer 504 to be copied to the non-volatile memory 508, thereby saving the data that has not yet been saved to the MLC non-volatile memory devices in a corruption safe manner, thereby enabling the controller to acknowledge the write to the host 218. When power to the MLC non-volatile memory devices is restored, the data saved in the non-volatile memory 508 may be programmed into the MLC non-volatile memory devices.

It is to be noted that the non-volatile memory 508 may, according to one embodiment, be written to only in the event of a power failure. Moreover, by powering only the controller 502, the volatile memory buffer 504 and the non-volatile memory 508 in the event of a power failure, comparatively less power is required than would be required to also power the dies of the MLC non-volatile memory devices (e.g., Flash Blocks 206). It is to be noted that the non-volatile memory 508 may draw its power from the controller 502 that is powered by the backup power source 506. According to one embodiment, the non-volatile memory 508 may comprise MRAM. According to one embodiment, the backup power source 506 need only be coupled to the controller 502 and to the volatile memory buffer 504. In addition, by using the volatile memory buffer 504 as the primary write location in the data path and the non-volatile memory 508 in the event of a power failure, the wear on the non-volatile memory 508 is reduced.

Figure 6:
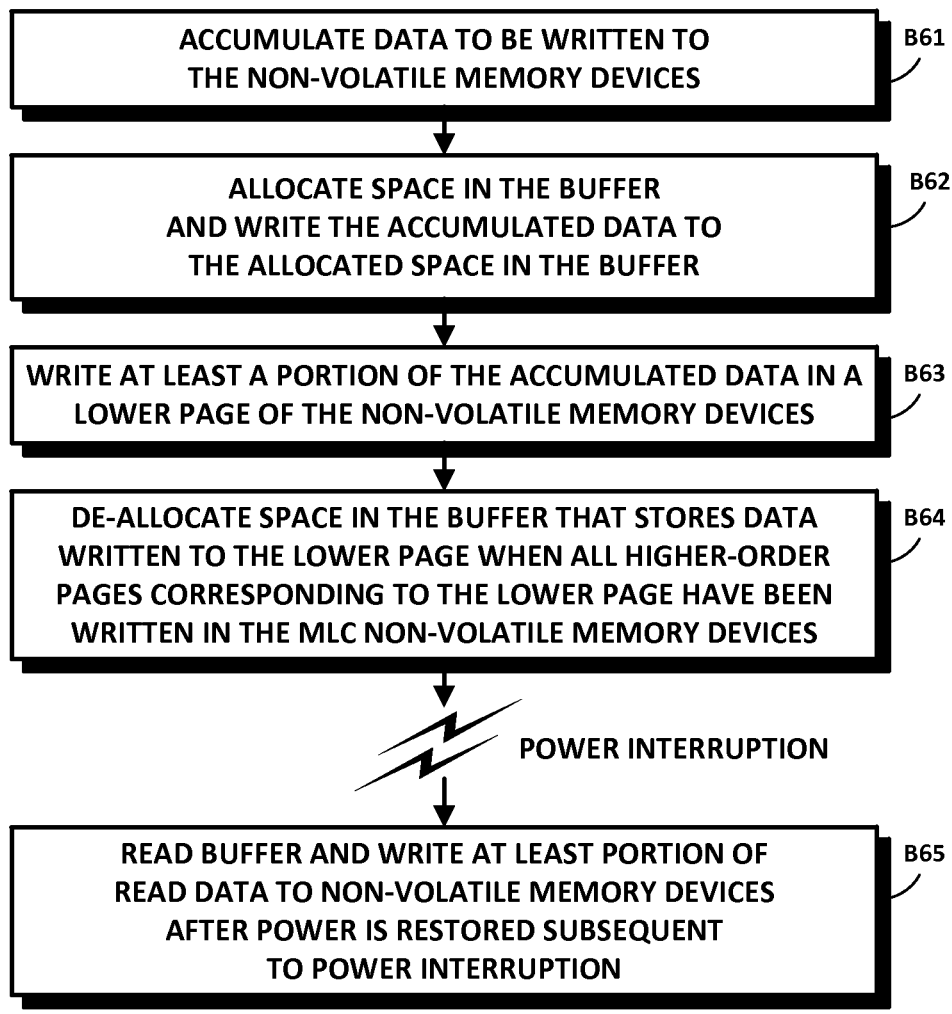
FIG. 6 is a flowchart of a method of controlling a data storage device according to one embodiment.

FIG. 6 is a flowchart of a method of controlling a data storage device according to one embodiment. The data storage device may comprise a buffer and a plurality of Multi-Level Cell (MLC) non-volatile memory devices (comprising, e.g., the Flash Blocks 206). The MLC non-volatile memory devices may comprise, as described herein, a plurality of lower pages and a corresponding plurality of higher-order pages. A controller, such as shown at 502, may be configured to write and read data to and from the plurality of lower pages and the corresponding plurality of higher-order pages. According to one embodiment and as shown in FIG. 6, the method may comprise accumulating data to be written to the MLC non-volatile memory devices, as shown at Block B61. Block B62 calls for allocating space in a buffer 208, 504 and writing the accumulated data to the allocated space in the buffer 208, 504. As shown at B63, at least a portion of the accumulated data may be written to one or more lower pages of the MLC non-volatile memory devices. It is understood that a portion of the accumulated data may also be written to one or more upper pages of the MLC non-volatile memory devices. When all higher-order pages corresponding to the lower page have been written in the MLC non-volatile memory devices, space in the buffer that stores data written to the lower page may be safely de-allocated, as called for in Block B64.

According to one embodiment and as shown in FIG. 2, the buffer may comprise or be configured as a non-volatile memory such as, for example, Magnetic Random Access Memory (MRAM). As described relative to FIG. 2 and as shown at B65 in FIG. 5, the method may also comprise reading data from the buffer 208 and writing at least a portion of the read data to the MLC non-volatile memory devices, after power is restored to the data storage device subsequent to a loss thereof. As described relative to FIG. 5, the method may also comprise reading data from the volatile memory buffer 504 and writing at least a portion of the read data to the non-volatile memory 508, after power is restored (e.g., by the backup power source 506) to the data storage device after a power loss, as shown at B65 in FIG. 6. According to one embodiment, the buffer 208, 504 may be at least sufficiently large to enable recovery from a possible lower page corruption after a power loss to the data storage device. According to one embodiment, the buffer 208, 504 may be configured as one or more buffers. A write acknowledgment to the host 218 may be generated and sent after the accumulated data is written to the allocated space in the buffer 208, 504, as the data may be considered, from that point in time forward, to be corruption-safe. According to one embodiment, the MLC non-volatile memory devices may be configured to comprise a plurality of blocks, each of which comprising a plurality of physical pages. A collection of such blocks may define a superblock (S-Block). A collection of physical pages with one physical page per block in an S-Block may define a superpage (S-Page), which may be the unit by which the controller 202 accumulates, writes and stores host and/or other data. Other data organizations and units may be implemented within the present context.

As shown in and described relative to FIG. 5, the method may also comprise providing a backup source of power 506 and a non-volatile memory, such as a non-volatile memory, such as shown at 508. The buffer 504, in this embodiment, may comprise volatile memory. The method may, according to one embodiment, further comprise powering at least a portion of the data storage device 500 for at least as long as necessary for the controller 502 to write the data from the buffer 504 to the non-volatile memory 508. According to one embodiment, after power is restored to the data storage device after a loss thereof, at least a portion of the data in the non-volatile memory 508 may be written to the MLC non-volatile memory devices. A write store (203 in FIGS. 2 and 5) may be provided, and the controller 202, 502 may be configured to write the accumulated data to the write store 203 as the accumulated data is written to the allocated space in the buffer 208, 504. According to one embodiment, the controller 202, 502 may also be configured to de-allocate space, in the buffer 208, 504, that stores data written to the higher-order pages when all higher-order pages corresponding to the lower page have been written in the MLC non-volatile memory devices, as such data may be considered to be corruption-safe.

While certain embodiments have been described, these embodiments have been presented by way of example only, and are not intended to limit the scope of the present disclosure. Indeed, the novel methods, devices and systems described herein may be embodied in a variety of other forms. Furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure. For example, those skilled in the art will appreciate that in various embodiments, the actual structures may differ from those shown in the figures. Depending on the embodiment, certain of the steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. A data storage device, comprising:
 a plurality of Multi-Level Cell (MLC) non-volatile memory devices comprising a plurality of lower pages and a corresponding plurality of higher-order pages;
 a controller coupled to the plurality of MLC non-volatile memory devices and configured to write data to and read data from the plurality of lower pages and the corresponding plurality of higher-order pages; and
 a buffer comprising non-volatile memory, the buffer being separate from the plurality of MLC non-volatile memory devices and coupled to the controller;
 wherein the controller is configured to:

accumulate data to be written to the MLC non-volatile memory devices;

allocate space in the buffer and write the accumulated data to the allocated space in the buffer;

write at least a portion of the accumulated data in a lower page of the MLC non-volatile memory devices;

detect a loss of power;

read data from the buffer and write at least a portion of the read data to the MLC non-volatile memory devices after power is restored to the data storage device subsequent to detecting the loss of power; and de-allocate space in the buffer that stores data written to the lower page when all higher-order pages corresponding to the lower page have been written in the MLC non-volatile memory devices.

2. The data storage device of claim 1, wherein the non-volatile memory comprises Magnetic Random Access Memory (MRAM).

3. The data storage device of claim 1, wherein the buffer is at least sufficiently large to enable recovery from lower page corruption after a power loss to the data storage device.

4. The data storage device of claim 1, wherein the MLC non-volatile memory devices are configured to operate in lower page only mode or in Single Level Cell (SLC) mode.

5. The data storage device of claim 1, wherein the controller is further configured to generate and send a write acknowledgement to a host after the accumulated data is written to the allocated space in the buffer.

6. The data storage device of claim 1, wherein the MLC non-volatile memory devices comprise a plurality of blocks, each of the plurality of blocks comprising a plurality of physical pages, a collection of blocks defining a superblock (S-Block), a collection of physical pages with one physical page per block in an S-Block defining a superpage (S-Page), and wherein the data is accumulated, written and stored in units of S-Pages.

7. The data storage device of claim 1, further comprising a backup source of power and a non-volatile memory, wherein the buffer comprises volatile memory and wherein the backup source of power is configured to power at least a portion of the data storage device at least as long as necessary for the controller to write the data from the buffer to the non-volatile memory.

8. The data storage device of claim 7, wherein the non-volatile memory comprises Magnetic Random Access Memory (MRAM).

9. The data storage device of claim 7, wherein the controller is further configured to write at least a portion of the data in the non-volatile memory to the MLC non-volatile memory devices, after power is restored to the data storage device after a loss of power.

10. The data storage device of claim 1, further comprising a write store and wherein the controller is further configured to write the accumulated data to the write store as the accumulated data is written to the allocated space in the buffer.

11. The data storage device of claim 1, wherein controller is further configured to also de-allocate space in the buffer that stores data written to the higher-order pages when all higher-order pages corresponding to the lower page have been written in the MLC non-volatile memory devices.

12. A data storage device controller, comprising:

a processor configured to couple to a buffer comprising non-volatile memory and to a plurality of Multi-Level Cell (MLC) non-volatile memory devices that comprise a plurality of lower pages and a corresponding plurality of higher-order pages, the buffer being separate from the plurality of MLC non-volatile memory devices, the processor being further configured to:

read data from the plurality of lower pages and the corresponding plurality of higher-order pages; and write data to the plurality of lower pages and the corresponding plurality of higher-order pages by at least:

accumulating data to be written to the MLC non-volatile memory devices;

allocating, space in the buffer and writing the accumulated data to the allocated space in the buffer;

writing at least a portion of the accumulated data in a lower page of the MLC non-volatile memory devices;

detecting a loss of power;

reading data from the buffer and writing at least a portion of the read data to the MLC non volatile memory devices after power is restored to the data storage device subsequent to detecting the loss of power; and de-allocating space in the buffer that stores data written to the lower page when all higher-order pages corresponding to the tower page have been written in the MLC non-volatile memory devices.

13. The data storage device controller of claim 12, wherein the non-volatile memory comprises Magnetic Random Access Memory (MRAM).

14. The data storage device controller of claim 12, wherein the buffer is at least sufficiently large to enable recovery from lower page corruption after a power loss to the data storage device.

15. The data storage device controller of claim 12, wherein the MLC non-volatile memory devices are configured to operate in lower page only mode or in Single Level Cell (SLC) mode.

16. The data storage device controller of claim 12, wherein the processor is further configured to generate and send a write acknowledgement to a host after the accumulated data is written to the allocated space in the buffer.

17. The data storage device controller of claim 12, wherein the MLC non-volatile memory devices comprise a plurality of blocks, each of the plurality of blocks comprising a plurality of physical pages, a collection of blocks defining a superblock (S-Block), a collection of physical pages with one physical page per block in an S-Block defining a superpage (S-Page), and wherein the data is accumulated, written and stored in units of S-Pages.

18. The data storage device controller of claim 12, further comprising a backup source of power and a non-volatile memory, wherein the buffer comprises volatile memory and wherein the backup source of power is configured to power at least a portion of the data storage device at least as long as necessary for the controller to write the data from the buffer to the non-volatile memory.

19. The data storage device controller of claim 18, wherein the non-volatile memory comprises Magnetic Random Access Memory (MRAM).

20. The data storage device controller of claim 18, wherein the processor is further configured to write at least a portion of the data in the non-volatile memory to the MLC non-volatile memory devices, after power is restored to the data storage device after a loss of power.

21. The data storage device controller of claim 12, further comprising a write store and wherein the processor is further configured to write the accumulated data to the write store as the accumulated data is written to the allocated space in the buffer.

22. The data storage device controller of claim 12, wherein processor is further configured to also de-allocate space in the buffer that stores data written to the higher-order pages when all higher-order pages corresponding to the lower page have been written in the MLC non-volatile memory devices.

23. A method of controlling a data storage device, the data storage device comprising a buffer comprising non-volatile memory and a plurality of Multi-Level Cell (MLC) non-volatile memory devices that comprise a plurality of lower pages and a corresponding plurality of higher-order pages, the buffer being separate from the plurality of MLC non-volatile memory devices, the method comprising:
  reading data from the plurality of lower pages and the corresponding plurality of higher-order pages; and
  writing, data to the plurality of lower pages and the corresponding plurality of higher-order pages by at least:
    accumulating data to be written to the MLC non-volatile memory devices;
    allocating space in the separate buffer and writing the accumulated data to the allocated space in the separate buffer;
    writing at least a portion of the accumulated data in a lower page of the MLC non-volatile memory devices;
    detecting a loss of power;
    reading data from the separate buffer and writing at least a portion of the read data to the MLC non-volatile memory devices after power is restored to the data storage device subsequent to detecting the loss of power; and
    de-allocating space in the separate buffer that stores data written to the lower page when all higher-order pages corresponding to the lower page have been written in the MLC non-volatile memory devices.

24. The method of claim 23, wherein the non-volatile memory comprises Magnetic Random Access Memory (MRAM).

25. The method of claim 23, wherein the buffer is at least sufficiently large to enable recovery from lower page corruption after a power loss to the data storage device.

26. The method of claim 23, wherein the MLC non-volatile memory devices are configured to operate in lower page only mode or in Single Level Cell (SLC) mode.

27. The method of claim 23, further comprising generating and sending a write acknowledgement to a host after the accumulated data is written to the allocated space in the buffer.

28. The method of claim 23, wherein the MLC non-volatile memory devices comprise a plurality of blocks, each of the plurality of blocks comprising a plurality of physical pages, a collection of blocks defining a superblock (S-Block), a collection of physical pages with one physical page per block in an S-Block defining a superpage (S-Page), and accumulating, writing and storing is carried out in units of S-Pages.

29. The method of claim 23, further comprising a backup source of power and a non-volatile memory, wherein the buffer comprises volatile memory and wherein the method further comprises the backup source of power powering at least a portion of the data storage device at least as long as necessary for the controller to write the data from the buffer to the non-volatile memory.

30. The method of claim 29, wherein the non-volatile memory comprises Magnetic Random Access Memory (MRAM).

31. The method of claim 29, further comprising writing at least a portion of the data in the non-volatile memory to the MLC non-volatile memory devices, after power is restored to the data storage device after a loss of power.

32. The method of claim 23, wherein the data storage device further comprises a write store and wherein writing data further comprises writing the accumulated data to the write store as the accumulated data is written to the allocated space in the buffer.

33. The method of claim 23, further comprising de-allocating space in the buffer that stores data written to the higher-order pages when all higher-order pages corresponding to the lower page have been written in the MLC non-volatile memory devices.

* * * * *